(12) United States Patent
Bender

(10) Patent No.: US 7,034,322 B2
(45) Date of Patent: Apr. 25, 2006

(54) FLUID JET ELECTRIC DISCHARGE SOURCE

(75) Inventor: Howard A. Bender, Ripon, CA (US)

(73) Assignee: EUV LLC, Santa Clara, CA (US)

( * ) Notice: Subject to any disclaimer, the term of this patent is extended or adjusted under 35 U.S.C. 154(b) by 216 days.

(21) Appl. No.: 09/877,329

(22) Filed: Jun. 7, 2001

(65) Prior Publication Data
US 2003/0038255 A1 Feb. 27, 2003

(51) Int. Cl.
*H01K 7/00* (2006.01)

(52) U.S. Cl. ............ 250/504 R; 250/292; 250/492.21

(58) Field of Classification Search ............ 250/504 R, 250/292, 492.21; 378/119
See application file for complete search history.

(56) References Cited

U.S. PATENT DOCUMENTS

| | | | |
|---|---|---|---|
| 5,577,092 A | | 11/1996 | Kublak et al. .............. 378/119 |
| 5,637,962 A | * | 6/1997 | Prono et al. ............ 315/111.21 |
| 5,821,548 A | * | 10/1998 | Hinchliffe .............. 250/492.21 |
| 6,031,241 A | | 2/2000 | Silfvast et al. .......... 250/540 R |
| 6,107,628 A | * | 8/2000 | Smith et al. ................ 250/292 |
| 6,188,076 B1 | | 2/2001 | Silfvast et al. .......... 250/504 R |
| 6,452,194 B1 | * | 9/2002 | Bijkerk et al. ........... 250/492.2 |

* cited by examiner

Primary Examiner—Hai Pham
Assistant Examiner—Lam Nguyen
(74) Attorney, Agent, or Firm—Blakely, Sokoloff, Taylor & Zafman LLP

(57) ABSTRACT

A fluid jet or filament source and a pair of coaxial high voltage electrodes, in combination, comprise an electrical discharge system to produce radiation and, in particular, EUV radiation. The fluid jet source is composed of at least two serially connected reservoirs, a first reservoir into which a fluid, that can be either a liquid or a gas, can be fed at some pressure higher than atmospheric and a second reservoir maintained at a lower pressure than the first. The fluid is allowed to expand through an aperture into a high vacuum region between a pair of coaxial electrodes. This second expansion produces a narrow well-directed fluid jet whose size is dependent on the size and configuration of the apertures and the pressure used in the reservoir. At some time during the flow of the fluid filament, a high voltage pulse is applied to the electrodes to excite the fluid to form a plasma which provides the desired radiation; the wavelength of the radiation being determined by the composition of the fluid.

12 Claims, 2 Drawing Sheets

US 7,034,322 B2

FLUID JET ELECTRIC DISCHARGE SOURCE

STATEMENT OF GOVERNMENT INTEREST

This invention was made with Government support under contract no. DE-AC04-94AL85000 awarded by the U. S. Department of Energy to Sandia Corporation. The Government has certain rights in the invention.

CROSS-REFERENCE TO RELATED APPLICATIONS

Not applicable.

BACKGROUND OF THE INVENTION

The present invention is directed generally to an electric discharge source for generating radiation, comprising a system for producing a fluid filament or jet of controlled dimension in combination with coaxial electrodes, and particularly to a electric discharge source for generating extreme ultraviolet radiation.

Integrated circuits are typically manufactured using lithographic processes. Radiation (i.e., light) is caused to interact selectively with a photosensitive resist material deposited onto a substrate in such a way that a pattern or image from a mask is produced on the resist material. The resist material is developed and the pattern is transferred onto the substrate by etching.

In order to satisfy the demand for an increasing number of transistors contained on an integrated circuit it has become necessary to replace the present design rule of 0.5 µm by design rules that require feature sizes of 0.25 to 0.18 µm and significant effort is presently being put into achieving 0.1 µm resolution. However, as the feature size decreases, the wavelength of light required for submicron resolution decreases (for a design rule of 0.1 µm light with a wavelength of about 13 to 15 nanometer (nm) is preferred).

Extreme ultraviolet radiation (EUV), i.e., radiation having a wavelength in the range of 3.5–15 nm, can be produced by a variety of sources including laser produced plasma, synchrotron radiation, high-harmonic generation with femtosecond laser pulses, discharge-pumped x-ray lasers, and electron beam driven devices. Of these, a laser produced plasma has been shown to be an efficient source of EUV. In particular, a plasma produced by directing a laser at a target composed of frozen pellets of krypton or xenon or condensed xenon or krypton gases as they expand through a supersonic nozzle into a vacuum chamber, such as disclosed in U.S. Pat. No. 5,577,092 "Cluster Beam Targets for Laser Plasma Extreme Ultraviolet and Soft X-ray Sources", issued to Kubiak et al., has been shown to be a stable source of EUV radiation. While laser produced plasmas are able to convert between 1 and 4% of the incident laser power into EUV light, the cost and complexity of the integrated laser and Xe light source is high compared with conventional light sources. Moreover, it is not clear that the laser-produced plasma can achieve the required output of 30–60 W of EUV source power at acceptable manufacturing costs. Furthermore, because laser plasma systems exhaust large quantities of Xe gas into the target chamber a gas recirculation system is required to recapture the excess Xe in order to maintain a low background pressure in the target chamber and keep Xe costs down.

In an attempt to address the issues of complexity and high cost as well as achieving the desired 30–60 W EUV source power, efforts have been directed to discharge sources for producing EUV radiation and particularly capillary discharge sources such as those disclosed in U.S. Pat. Nos. 5,499,282 "Efficient Narrow Spectral Width Soft X-ray Discharge Sources", U.S. Pat. No. 6,188,076 "Discharge Lamp Sources Apparatus and Method, and 6,031,241, "Capillary Discharge Extreme Ultraviolet Lamp Source for EUV Microlithography and Other Related Applications", issued to Silfvast et al.

A capillary discharge source, such as that show n in U.S. Pat. No. 6,188,076 and illustrated schematically in FIG. 1, generally consists of an insulating material 110 having an open capillary channel 115 filled with a gas that allow s for electrical conduction within the capillary. The capillary channel can be cylindrical shape and can have a diameter in the range of 0.5 to 3 mm and be about 0.5 to 10 mm long. Electrodes 120 and 125 are attached to insulating material 110 on either side of capillary channel 115. A high voltage pulse is applied to the electrodes to generate a plasma 130 thereby providing a beam of radiation whose wavelength is determined by the composition of the plasma. The radiation, emitted along the capillary axis, can be collected and directed for some purpose such as EUV lithography.

While capillary discharge sources are compact and provide a relatively low cost and efficient source of EUV radiation they do suffer from some significant drawbacks. In particular, debris generated by interaction of the plasma with the walls of the capillary and the electrodes is ejected from the capillary along the axis of the capillary. Consequently, mirrors and other light collecting optics that are directly in line with or proximate the capillary discharge source become quickly coated with the ablated material. This coating of ablated material reduces the effectiveness and lifetime of light collecting optics. Pre-processing methods, such as exposure to discharge current pulses and laser heat treatment, have been proposed to limit debris generation (cf. U.S. Pat. No. 6,188,076). However, these methods are time consuming and may not be successful enough to lower ablation levels to a low enough level to avoid coating of sensitive optical components.

Moreover, the capillary itself must be able to dissipate enough of the heat load generated when operated at high repetition rates to maintain its structural integrity. Thus, the thermal conductivity of the capillary material must be high enough so that the capillary can withstand the heat load, limiting the choice of capillary material. Furthermore, a discharge source for EUV lithography must be capable of operating in and compatible with a vacuum atmosphere.

SUMMARY OF THE INVENTION

Accordingly, the present invention is directed to an electric discharge source that uses a fluid jet or filament to provide a plasma, thereby eliminating the need for a capillary and thus avoiding the issues of material ablation and heat loading that plague conventional capillary discharge sources. By using a thin fluid jet or filament to provide the material for the discharge source plasma, the high gas loadings characteristic of laser plasma pulse systems are avoided.

In the present invention a fluid, that can be either a gas or a liquid, is fed continuously into a first reservoir at some pressure greater than atmospheric where it is allowed to expand through an aperture, that can be a nozzle or pinhole, into a second reservoir. The expanding fluid escapes from the second reservoir through a second aperture. This has the effect of producing a narrow jet or filament of fluid; the jet diameter being determined, in part, by the size of the aperture. The fluid jet is directed into a region between coaxial high voltage electrodes where a plasma is produced by applying a high voltage to the electrodes. The radiation from the plasma can be extracted from the discharge source either along the filament axis, to form a point source, or at 90° to the filament axis to produce a line source.

BRIEF DESCRIPTION OF THE DRAWINGS

The accompanying drawings, which are incorporated in and form part of the specification, illustrate the present invention and, together with the description, explain the invention. In the drawings like elements are referred to by like numbers.

DETAILED DESCRIPTION OF THE INVENTION

The present invention is directed, generally, to a liquid jet or filament system and a pair of coaxial high voltage electrodes that, in combination, comprise an electrical discharge system that can be used to produce radiation. The wavelength of the emitted radiation is determined by the choice of fluid that comprises the fluid jet. The fluid, either a liquid or a gas, that forms the filament or jet can consist of one or more than one species, depending upon the application. In particular, the invention is directed an electrical discharge system that employs a liquid jet or filament of xenon or krypton to generate a plasma that will produce EUV radiation in the desired 11 to 14 nm range.

Figure 1:
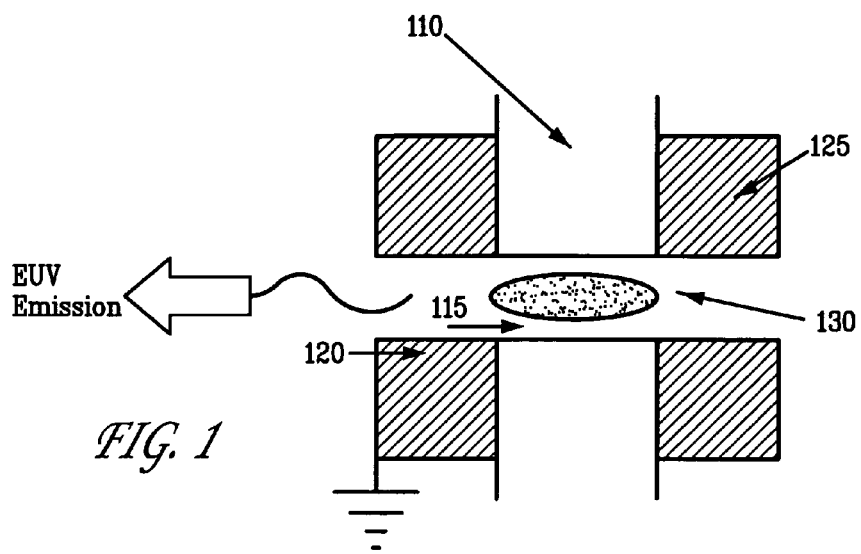
FIG. 1 illustrates a prior art capillary discharge system.
Figure 2:
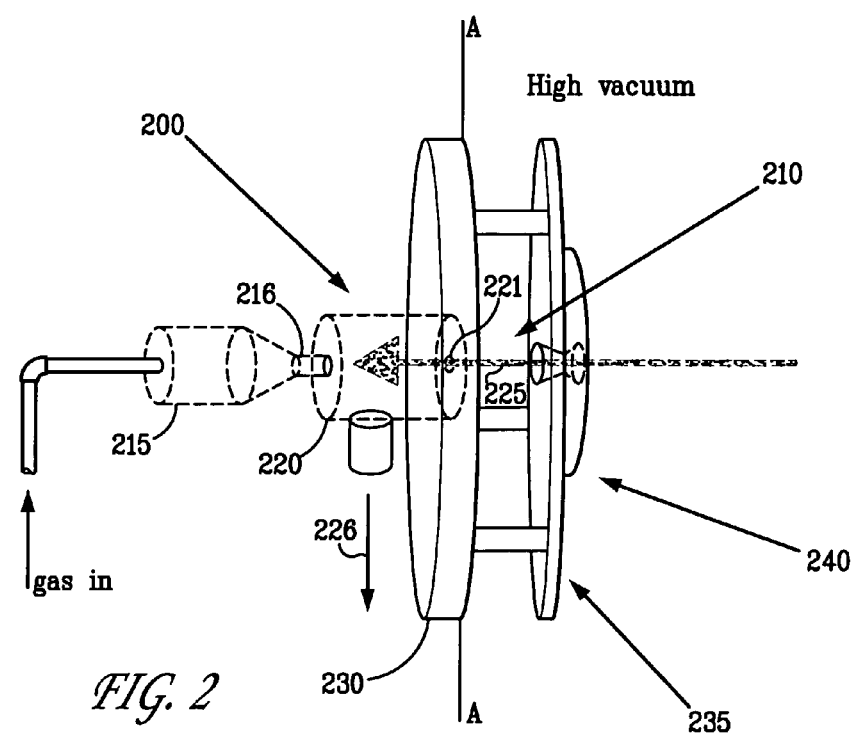
FIG. 2 is a schematic view of the fluid jet discharge source.

The invention will now be illustrated and exemplified by a discharge system using a gas jet for producing EUV radiation. It should be noted that throughout the written description of this invention the terms "filament" and "jet" will be used interchangeably and synonymously. The example below is provided for purposes of clarity and understanding of the principles of this invention, the scope and extent of the invention being defined by the concluding claims. Referring now to FIG. 2 which illustrates a gas jet electrical discharge source for producing EUV radiation, the source comprises two principle components; a gas jet system 200 and an electrical discharge system 210, comprising coaxially arranged electrodes. The gas jet system comprises at least two serially connected reservoirs, a first reservoir or chamber 215 into which a gas can be fed at some pressure higher than atmospheric and a second reservoir or chamber 220 connected to the first reservoir by connector 216 that serves as an aperture allowing the gas contained in reservoir 215 to expand into a second reservoir or chamber 220, whose pressure is below that of reservoir 215. The pressure in reservoir 220 can be maintained at an appropriate level by pumping means 226, such as by differential pumping.

The gas in reservoir 220 it is allowed to escape through a second aperture 221 into a region of yet lower pressure. This second expansion produces a narrow filament or jet of well-directed gas 225. The filament size can be adjusted by and is dependent on the size and configuration of the apertures and the pressure used in the reservoir and can range from tens to hundreds of microns (μm) in diameter. This dimension is typically maintained for a few millimeters from the second aperture before dissipating.

Figure 3:
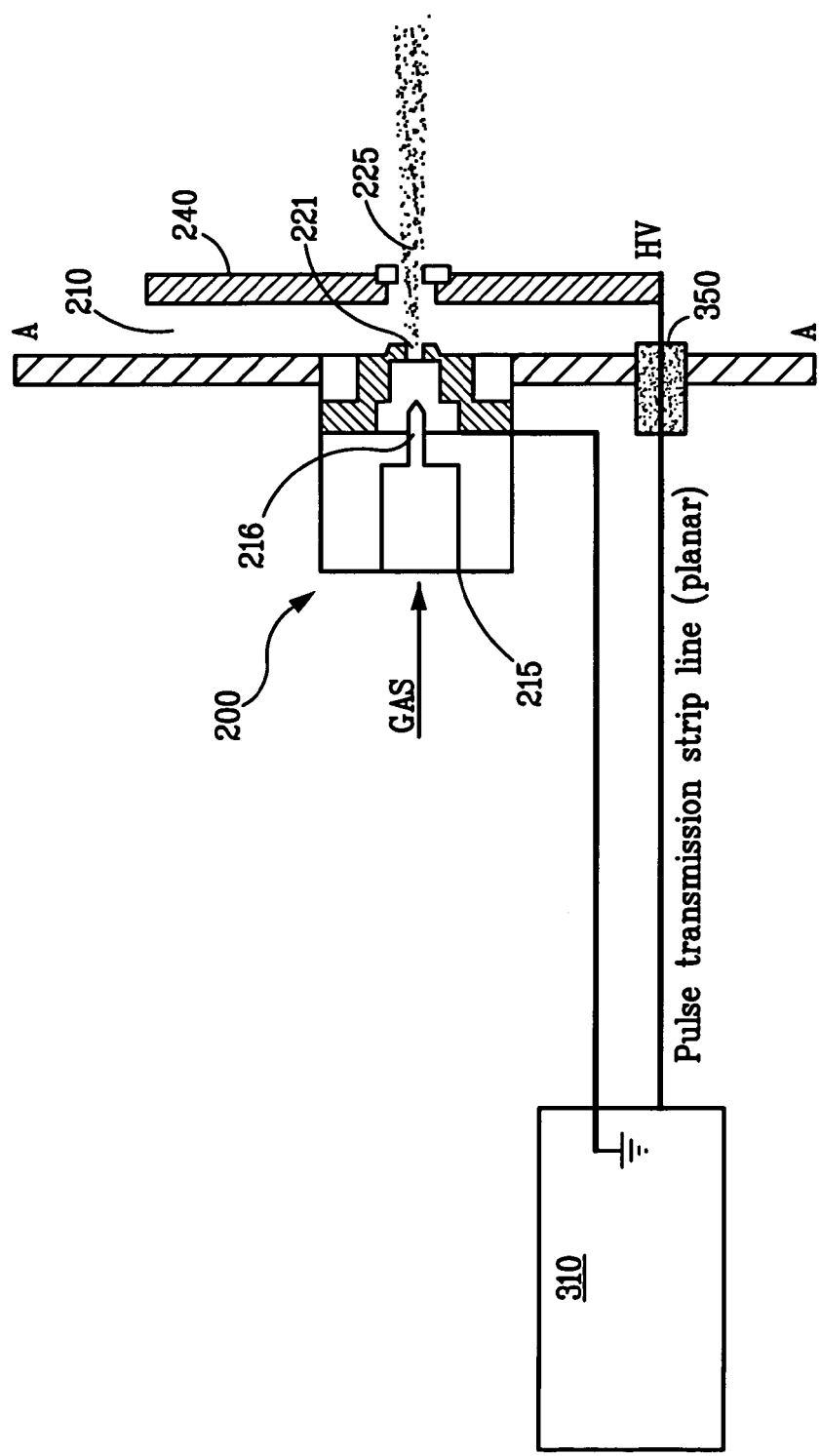
FIG. 3 shows an embodiment of the liquid jet source and associated electrical driver means.

After exiting aperture 221, the gas jet passes into the high vacuum region A between ground electrode 230 and high voltage electrode 240, wherein the electrodes are separated by insulator means 235. It should be noted that aperture 221 can be formed by a pinhole in ground electrode 230. At some time during the flow of the gas jet, a high voltage pulse is applied to electrode 240 to excite the gas to form a plasma which provides the desired radiation; the wavelength of the radiation being determined by the composition of the gas. The high voltage pulse can be provided by means of strip lines from an electrical supply means such as an electrical pulser or driver 310, as shown in FIG. 3. The strip line geometry can be planar or coaxial. An insulator 350 can or cannot be used in order to produce the desired type of discharge.

It is desirable to keep the gas density distribution along the filament as uniform as possible since the actual formation of the discharge along the filament is determined by the uniformity of the gas distribution in the filament as well as the electrical discharge circuit parameters. Typical drive voltages are on the order of a few tens of kV with peak currents of from 1 to tens of kA. The discharge resembles that of a gas puff z-pinch, however, the peak currents of 5–10 kA needed for this source are not sufficient to initiate pinching of the plasma.

As will be appreciated by those skilled in the art, the gas density distribution is critical for operation as a source of EUV radiation. The peak gas density on the axis of the gas filament can be tailored by appropriate selection of aperture geometry and should be on the order of $10^{16}$–$10^{17}$/cm$^3$. It is believed that with suitable peak drive current the discharge current will flow on a narrow sheath surrounding the filament without any appreciable inward motion of the ionized gas in contrast to the z-pinch discharge which is driven at much higher peak currents and generally has lower conversion efficiency into EUV wavelengths of interest.

Unlike prior art capillary discharge sources, whose pulse repetition rate is limited by electrical driver pulse capabilities, the fluid jet system of the present invention can provide a high pulse frequency (repetition rate) since the fluid filament provides a constant replenishment of the fluid to be ionized. Moreover, the absence of the capillary that forms the basis for prior art capillary discharge systems means that there are few thermal limitations in the present system. The present gas filament system introduces such a low mass of gas into the EUV target chamber that the gas recirculation system required by prior art laser plasma pulse systems is not necessary.

In summary, the present invention is directed to a compact and efficient discharge system that can be used, inter alia, for producing EUV radiation. The system provides a fluid filament or jet, wherein the fluid can be a liquid or a gas, coupled with coaxially arranged electrodes that together comprise an electrical discharge system. By passing the fluid jet into the region between the coaxial electrodes and applying an electrical pulse thereto a plasma is formed.

The foregoing is intended to be illustrative of the present invention and is provided for purposes of clarity and understanding of the principles of this invention. Many other embodiments and modifications can be made by those of skill in the art without departing from the spirit and scope of the invention as defined in the following claims.

I claim:

1. An electrical discharge system for generating radiation, comprising:
    an electrode system comprising first and second coaxial electrodes, wherein the electrodes each have a concentric aperture therethrough;
    a fluid supply system, comprising a first and a second reservoir in fluid communication through an aperture, wherein the first reservoir is at a higher pressure than the second reservoir, arranged to inject a fluid through the aperture in the first electrode thereby forming an unconfined fluid filament between the electrodes, wherein the fluid filament is a liquid or a gas having a density of at least about $10^{16}$–$10^{17}$/cm$^3$ on the axis of the filament; and
    electrical supply means connected to the electrode system.

2. The electrical discharge system of claim 1, wherein the fluid comprises more than one species.

3. An electrical discharge system for producing extreme ultraviolet radiation, comprising:
    an electrode system comprising first and second coaxial electrodes, wherein the electrodes each have a concentric aperture therethrough;
    a fluid supply system, comprising a first and a second reservoir in fluid communication through an aperture, wherein the first reservoir is at a higher pressure than the second reservoir, arranged to inject a fluid through the aperture in the first electrode thereby forming an unconfined fluid filament between the electrodes, wherein the fluid filament is a liquid or a gas at a density of at least about $10^{16}$–$10^{17}$/cm$^3$ on the axis of the filament and wherein the fluid emits extreme ultraviolet as a plasma; and electrical supply means connected to the electrode system.

4. The electrical discharge system of claim 3, wherein the fluid comprises more than one species.

5. The electrical discharge system of either of claims 1 or 3, wherein the electrode system is maintained at a lower pressure than the fluid supply system.

6. The electrical discharge system of either of claims 1 or 3, wherein the electrical supply means provides a voltage of less than about 100 kV.

7. The electrical discharge system of either of claims 1 or 3, wherein the electrical supply means provides a current of less than about 50 kA.

8. The electrical discharge system of claim 7, wherein the peak current is between about 5–10 kA.

9. A method for producing radiation in the extreme ultraviolet wavelength region, comprising:
    providing an electrode system comprising a first an a second electrode, wherein the electrodes are disposed coaxially and wherein said first and second electrodes each have a concentric aperture therethrough;
    expanding a fluid from a fluid system comprising a first and a second reservoir in fluid communication through an aperture, wherein the first reservoir is at a higher pressure than the second reservoir, through the aperture concentric to form an unconfined filament, wherein the fluid is at a density of at least about $10^{16}$–$10^{17}$/cm$^3$ on the axis of the filament;
    directing the fluid filament between the coaxial electrodes; and
    subjecting the fluid filament to a high voltage to generate a plasma.

10. The method of claim 9, wherein the fluid is a gas including xenon or krypton.

11. The method of claim 9, wherein the fluid comprises more than one species.

12. The method of claim 9, wherein radiation from the plasma is extracted from the discharge source along the filament axis or 90° thereto.

* * * * *